(12) United States Patent
Yang et al.

(10) Patent No.: US 11,264,291 B2
(45) Date of Patent: Mar. 1, 2022

(54) SENSOR DEVICE AND ETCHING APPARATUS HAVING THE SAME

(71) Applicant: SAMSUNG ELECTRONICS CO., LTD., Suwon-si (KR)

(72) Inventors: Seeyub Yang, Seoul (KR); Jeongil Mun, Hwaseong-si (KR); Hyungjoo Lee, Hwaseong-si (KR); Kyoungsuk Kim, Suwon-si (KR); Kyeonghun Kim, Hwaseong-si (KR); Jongwoo Sun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/822,319

(22) Filed: Mar. 18, 2020

(65) Prior Publication Data
US 2020/0411390 A1 Dec. 31, 2020

(30) Foreign Application Priority Data

Jun. 26, 2019 (KR) .................. 10-2019-0076613

(51) Int. Cl.
*H01J 37/32* (2006.01)
*H01L 21/66* (2006.01)
*H01L 21/67* (2006.01)
*H01L 21/311* (2006.01)

(52) U.S. Cl.
CPC ........ *H01L 22/20* (2013.01); *H01J 37/32935* (2013.01); *H01L 21/31116* (2013.01); *H01L 21/67069* (2013.01); *H01L 21/67253* (2013.01)

(58) Field of Classification Search
CPC ............... H01L 21/67253; H01L 22/20; H01L 21/68735; H01L 21/6831; H01L 21/31116; H01L 21/67069; H01L 21/68742; H01J 37/32935
See application file for complete search history.

(56) References Cited

U.S. PATENT DOCUMENTS

| 6,244,121 | B1 * | 6/2001 | Hunter ................... G03F 7/707 |
| | | | 73/865.9 |
| 7,341,644 | B2 | 3/2008 | Sakano et al. |
| 9,841,395 | B2 | 12/2017 | Sugita et al. |
| 10,014,198 | B2 | 7/2018 | Richardson |
| 2005/0008217 | A1 * | 1/2005 | Luu .......................... H01L 22/20 |
| | | | 382/145 |

(Continued)

FOREIGN PATENT DOCUMENTS

| KR | 10-2006-0121362 | | 11/2006 |
| KR | 20060121362 | A * | 11/2006 |

(Continued)

*Primary Examiner* — Yuechuan Yu
(74) *Attorney, Agent, or Firm* — F. Chau & Associates, LLC

(57) ABSTRACT

An etching apparatus includes a reaction chamber having an internal space, a fixing chuck disposed in the reaction chamber, an electrostatic chuck disposed on the fixing chuck and on which a wafer is placed, a focus ring surrounding the electrostatic chuck, and a sensor device configured to be transferred into or out of the reaction chamber and placed on the electrostatic chuck. The sensor device includes a body having a plate shape, and a sensor disposed on an upper surface of the body which senses whether the focus ring is worn.

18 Claims, 9 Drawing Sheets

(56) References Cited

U.S. PATENT DOCUMENTS

| | | | |
|---|---|---|---|
| 2006/0137988 A1* | 6/2006 | Yahashi | H01L 21/67748 205/82 |
| 2006/0157698 A1* | 7/2006 | Miyajima | H01L 21/67288 257/48 |
| 2006/0238953 A1* | 10/2006 | Hanawa | H01L 21/6831 361/234 |
| 2009/0081542 A1 | 3/2009 | Patrick | |
| 2009/0101284 A1* | 4/2009 | Higuma | H01J 37/32532 156/345.51 |
| 2010/0025369 A1 | 2/2010 | Negishi et al. | |
| 2012/0249986 A1 | 10/2012 | Tanaka et al. | |
| 2016/0141154 A1* | 5/2016 | Kamata | H01J 37/32642 324/671 |
| 2016/0211166 A1 | 7/2016 | Yan et al. | |
| 2016/0336149 A1 | 11/2016 | Larsson et al. | |
| 2017/0032987 A1 | 2/2017 | Lee et al. | |
| 2017/0115657 A1 | 4/2017 | Trussell et al. | |
| 2017/0213758 A1 | 7/2017 | Rice et al. | |
| 2017/0236741 A1 | 8/2017 | Angelov et al. | |
| 2017/0287682 A1 | 10/2017 | Musselman et al. | |
| 2017/0287753 A1 | 10/2017 | Musselman et al. | |
| 2017/0301578 A1 | 10/2017 | Hong et al. | |
| 2018/0061696 A1 | 3/2018 | D'Ambra et al. | |
| 2018/0082824 A1 | 3/2018 | Likhanskii et al. | |
| 2018/0277416 A1 | 9/2018 | Takahashi et al. | |
| 2018/0308737 A1 | 10/2018 | Moriya et al. | |

FOREIGN PATENT DOCUMENTS

| | | |
|---|---|---|
| KR | 10-0783062 | 11/2007 |
| KR | 100783062 B1 * | 12/2007 |
| KR | 10-2010-0072231 | 6/2010 |
| KR | 10-2011-0057510 | 6/2011 |
| KR | 10-2012-0110063 | 10/2012 |
| KR | 10-2016-0059976 | 5/2016 |
| KR | 10-2016-0134577 | 11/2016 |
| KR | 10-2017-0014384 | 2/2017 |
| KR | 10-2017-0047149 | 5/2017 |
| KR | 10-2017-0048169 | 5/2017 |
| KR | 10-2017-0095137 | 8/2017 |
| KR | 10-2017-0113014 | 10/2017 |
| KR | 10-2017-0113339 | 10/2017 |
| KR | 10-2017-0118466 | 10/2017 |
| KR | 10-2018-0022593 | 3/2018 |
| KR | 10-2018-0052535 | 5/2018 |
| KR | 10-2018-0072689 | 6/2018 |
| KR | 10-2018-0099776 | 9/2018 |
| KR | 10-2018-0107743 | 10/2018 |
| KR | 10-2018-0110653 | 10/2018 |
| KR | 10-2019-0013362 | 2/2019 |

* cited by examiner

SENSOR DEVICE AND ETCHING APPARATUS HAVING THE SAME

CROSS-REFERENCE TO RELATED APPLICATIONS

This application claims priority under 35 U.S.C. § 119 to Korean Patent Application No. 10-2019-0076613 filed on Jun. 26, 2019 in the Korean Intellectual Property Office, the disclosure of which is incorporated by reference herein in its entirety.

TECHNICAL FIELD

The present inventive concept relates to a sensor device, and an etching apparatus having the same.

DISCUSSION OF THE RELATED ART

In a semiconductor etching process, components inside the etching equipment may be exposed to corrosive plasma for an extended period of time. As a result of this plasma exposure, the processing ability of a wafer being etched in the etching equipment may be negatively impacted. For example, the change in the processing ability of the edge portion of the wafer may be particularly impacted due to a focus ring of the etching equipment being worn as a result of the plasma exposure. This wear of the focus ring may decrease the quality of the manufactured wafer.

SUMMARY

Exemplary embodiments of the present inventive concept provide an etching apparatus capable of measuring an amount of wear of a focus ring.

Exemplary embodiments of the present inventive concept provide an etching apparatus capable of compensating for a height of a focus ring.

According to an exemplary embodiment of the present inventive concept, a sensor device includes a body having a shape corresponding to a shape of a wafer, an image sensor installed on the body which acquires an image of a focus ring, and a wireless transceiver which transmits data acquired from the image sensor. A height from a lower surface of the body to the higher of an upper surface of the image sensor or an upper surface of the wireless transceiver is about 20 mm or less.

According to an exemplary embodiment of the present inventive concept, an etching apparatus includes a reaction chamber having an internal space, a fixing chuck disposed in the reaction chamber, an electrostatic chuck disposed on the fixing chuck and on which a wafer is placed, a focus ring surrounding the electrostatic chuck, and a sensor device configured to be transferred into or out of the reaction chamber and placed on the electrostatic chuck. The sensor device includes a body having a plate shape, and a sensor disposed on an upper surface of the body which senses whether the focus ring is worn.

According to an exemplary embodiment of the present inventive concept, an etching apparatus includes a reaction chamber having an internal space, a fixing chuck disposed in the reaction chamber, an electrostatic chuck disposed on the fixing chuck and on which a wafer or a sensor device is placed, a focus ring disposed on an edge of the electrostatic chuck, a sensor device configured to be transferred into or out of the reaction chamber, and an elevating member which raises and lowers the focus ring. The sensor device includes a body having a shape corresponding to a shape of the wafer, and a sensor installed on the body which obtains an image of the focus ring.

BRIEF DESCRIPTION OF DRAWINGS

The above and other features of the present inventive concept will become more apparent by describing in detail exemplary embodiments thereof with reference to the accompanying drawings, in which.

DETAILED DESCRIPTION

Figure 1:
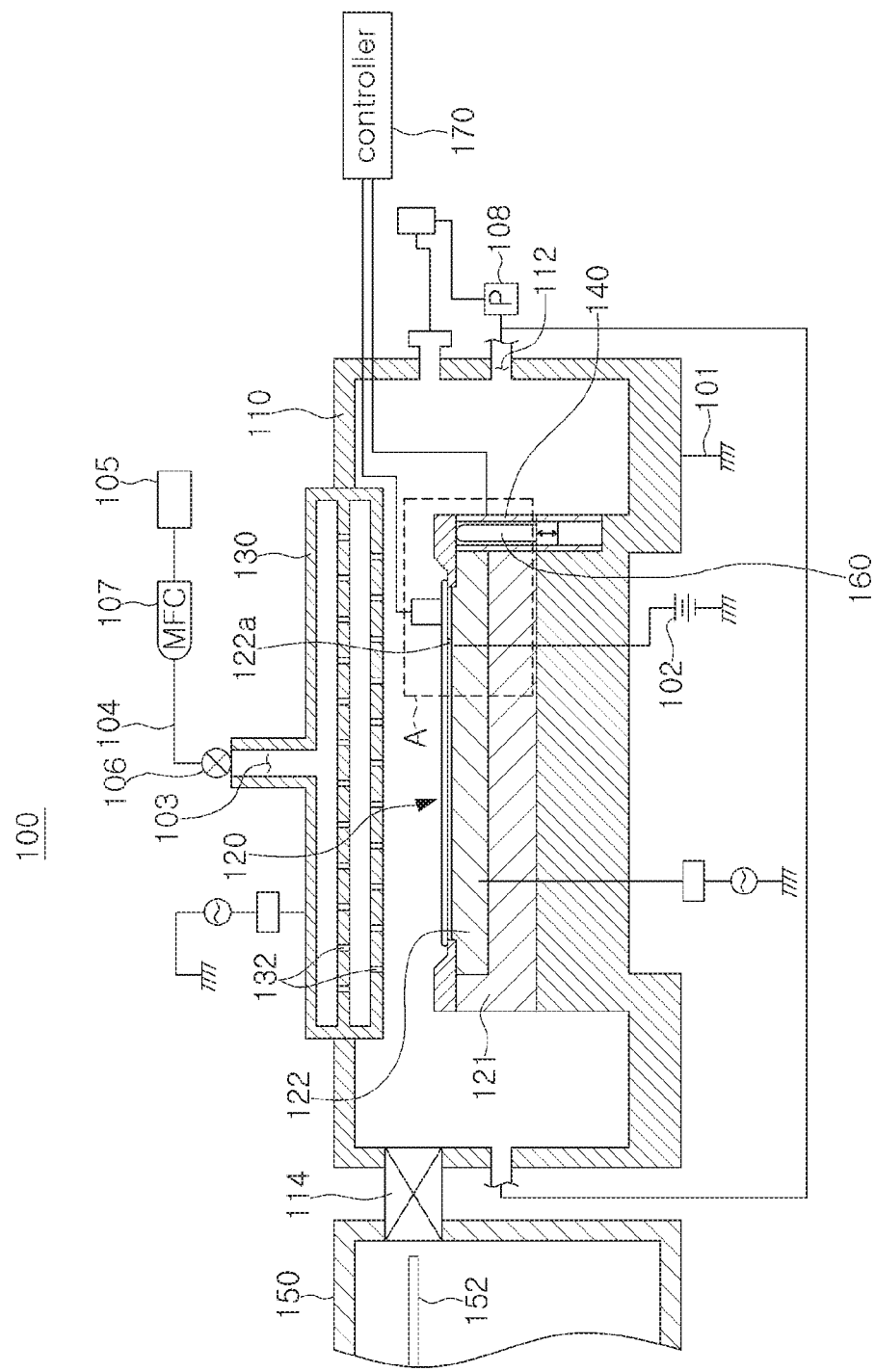
FIG. 1 is a configuration diagram illustrating an etching apparatus according to exemplary embodiments.

Exemplary embodiments of the present inventive concept will be described more fully hereinafter with reference to the accompanying drawings. Like reference numerals may refer to like elements throughout the accompanying drawings.

As used herein, the term "about" is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present.

FIG. 1 is a configuration diagram illustrating an etching apparatus according to exemplary embodiments.

Referring to FIG. 1, an etching apparatus 100 may include a reaction chamber 110 in which a wafer is loaded. The reaction chamber 110 may provide an internal space for performing an etching process on the loaded wafer, and may include a susceptor 120 having an electrostatic chuck 122 on which the wafer is placed, and an upper electrode 130 disposed above the susceptor 120. Each of the susceptor 120 and the upper electrode 130 may have a substantially cylindrical shape, and the reaction chamber 110 may be grounded via a ground line 101.

The electrostatic chuck 122 may be disposed above the susceptor 120 and may fix the wafer on the electrostatic chuck 122. The electrostatic chuck 122 may include, for example, two polyimide-based films and a conductive thin film disposed therebetween. The conductive thin film may be connected to a high-voltage direct current (DC) power supply 102 disposed outside of the reaction chamber 110.

When a predetermined voltage is applied to the conductive thin film from the high-voltage DC power supply 102, electric charges may be generated on surfaces of the polyimide-based films. As a result, a coulomb force may be generated, and the coulomb force may fix the wafer to an upper surface of the electrostatic chuck 122. A method of fixing the wafer is not limited to a method using the electrostatic chuck. For example, in exemplary embodiments, a method of fixing the wafer using a mechanical device such as a clamp may be used. In addition, the electrostatic chuck 122 may have three lift pins 122a (see FIG. 2) protruded in an upward direction. The lift pins 122a may serve to place the wafer loaded in the reaction chamber 110, or a sensor device 140 to be described later, on the electrostatic chuck 122.

The upper electrode 130 may be disposed above the electrostatic chuck 122 and may face the susceptor 120. A lower end portion of the upper electrode 130 may be made of silicon, which may stabilize atmosphere inside the reaction chamber 110 during the etching process. The silicon may be of a thickness such that high frequency power used for a plasma etching process is sufficiently transmitted. In addition, the upper electrode 130 may include components such as, for example, aluminum, anodized aluminum, etc.

A gas inlet 103 supplying gases supplied for the etching process may be disposed above the upper electrode 130. The gas inlet 103 may be connected to a reaction gas supply source 105 through a gas supply line 104, and a valve 106 and a mass flow controller (MFC) 107 controlling a flow rate may be arranged on the gas supply line 104. In this case, the upper electrode 130 may be a path for supplying reaction gas into the reaction chamber 110. To this end, the upper electrode 130 may be composed of a plurality of layers having a plurality of diffusion holes 132. The lower end portion of the upper electrode 130 may be, for example, a shower head structure or a hollow structure for uniform distribution of gas.

The reaction chamber 110 may be connected to a predetermined decompression device 108 (for example, a vacuum pump) through an exhaust pipe 112 disposed in a predetermined region. Therefore, the reaction chamber 110 may provide a low internal pressure which provides for good etching characteristics. A gate valve 114 may be disposed on a side wall of the reaction chamber 110, and a load lock chamber 150 having a wafer transfer arm 152 may be connected to the gate valve 114.

In an operation of transferring the wafer to the reaction chamber 110, a pressure of the load lock chamber 150 may be reduced to a level similar to a pressure of the reaction chamber 110, and the wafer transfer arm 152 may be used to transfer the wafer from the load lock chamber 150 to the reaction chamber 110. Then, the wafer transfer arm 152 may be transferred from the reaction chamber 110 to the load lock chamber 150, and then the gate valve 114 may be closed.

A detailed description of a fixing chuck 121, the electrostatic chuck 122, a focus ring 123, a sensor device 140, and an elevating member 160 of the susceptor 120 will be described later.

Figure 2:
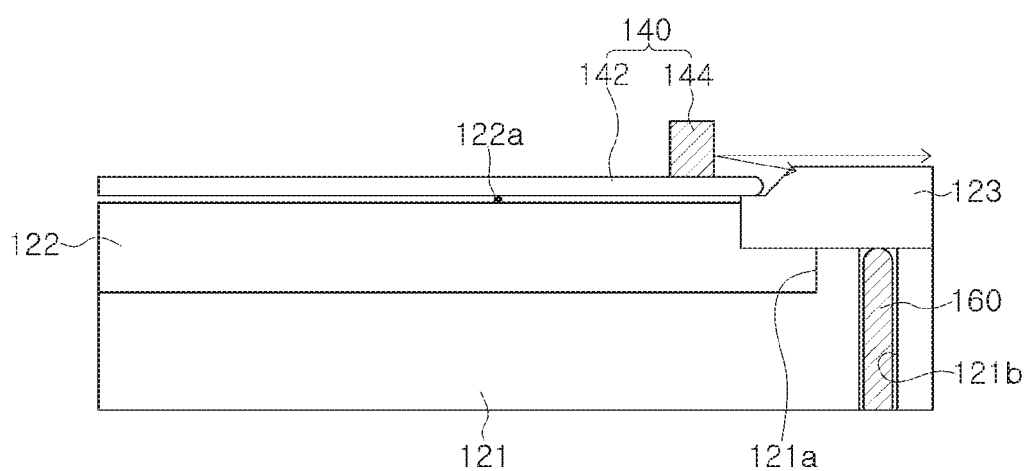
FIG. 2 is an enlarged view illustrating portion A of FIG. 1.
Figure 3:
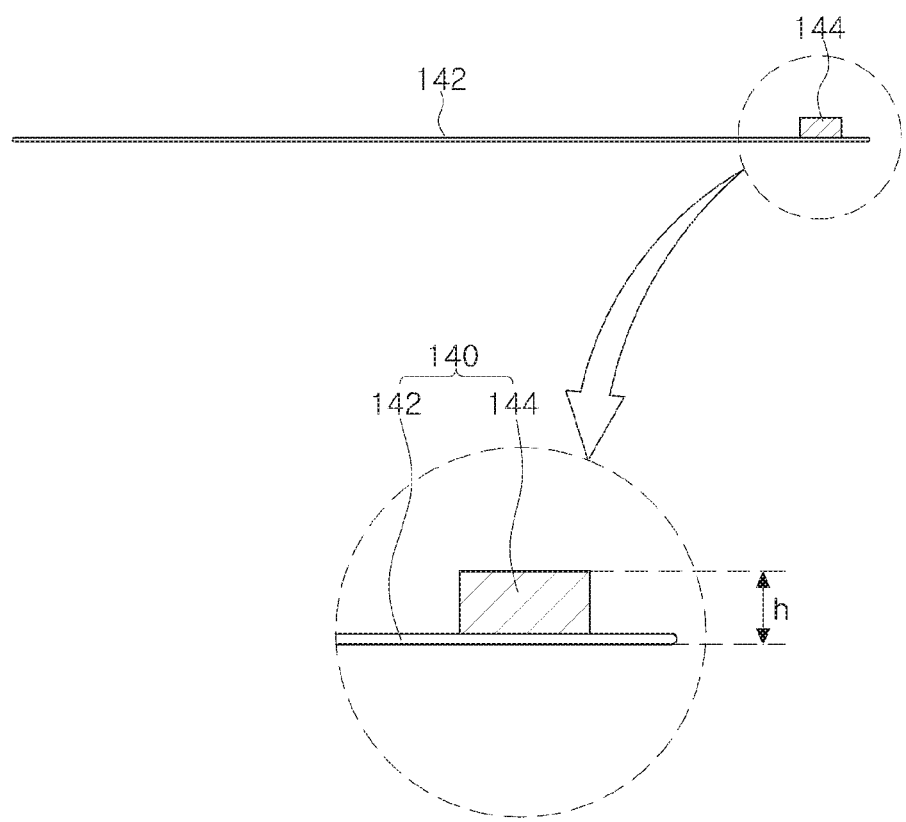
FIG. 3 is a view illustrating a height of a sensor device of an etching apparatus according to exemplary embodiments.
Figure 4:
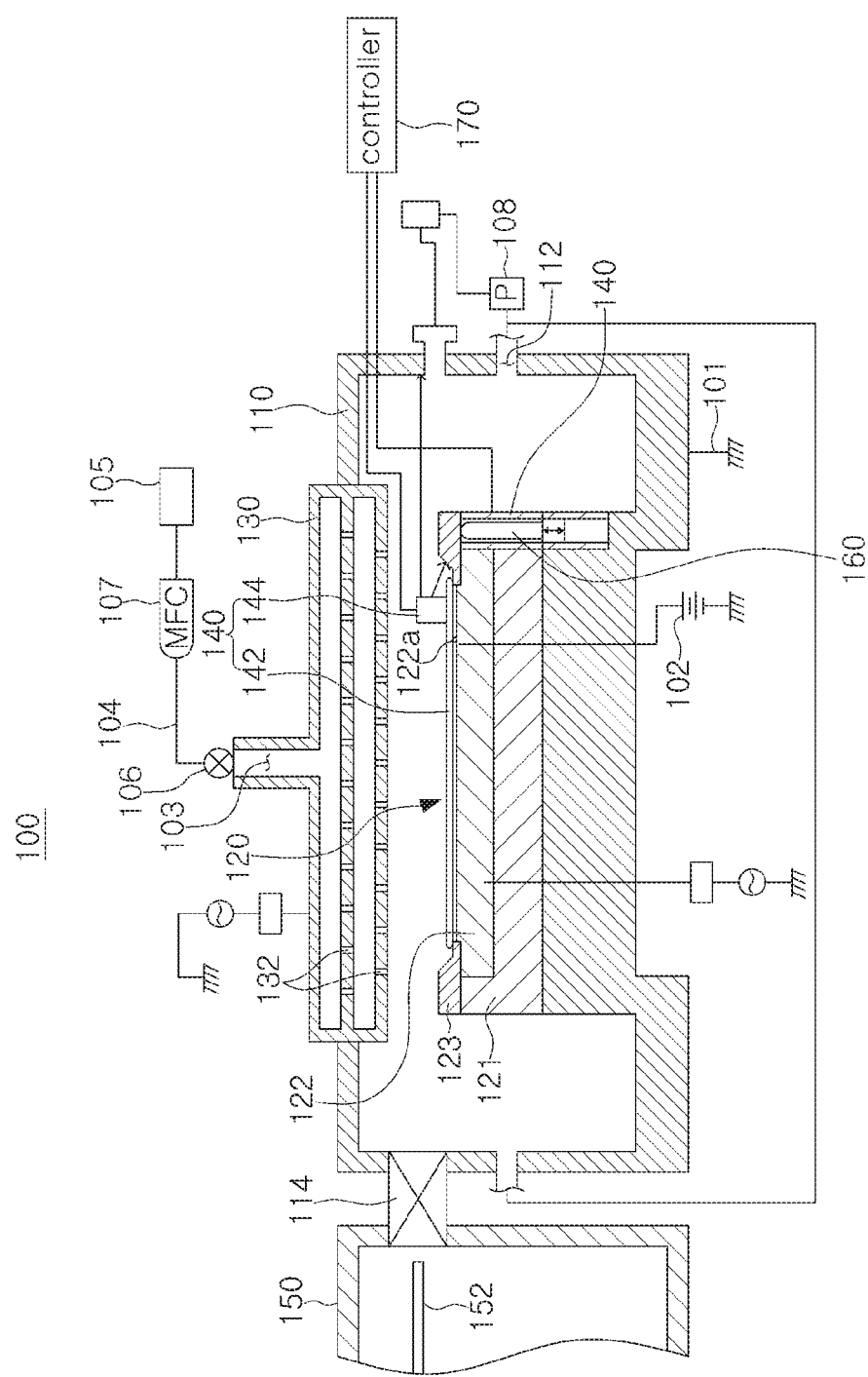
FIG. 4 is a view illustrating an operation of an etching apparatus according to exemplary embodiments.

FIG. 2 is an enlarged view illustrating portion A of FIG. 1. FIG. 3 is a view illustrating a height of a sensor device of an etching apparatus according to exemplary embodiments. FIG. 4 is a view illustrating an operation of an etching apparatus according to exemplary embodiments.

Referring to FIGS. 1 to 4, a fixing chuck 121 may be provided with an installation groove 121a in which the electrostatic chuck 122 is installed. A through-hole 121b in which the elevating member 160 is installed may be formed in an edge portion of the fixing chuck 121. The number of the through-holes 121b may correspond to the number of the elevating members 160. For example, three or more through-holes 121b may be provided, and three or more corresponding elevating members 160 may also be provided. The fixing chuck 121 may be formed of a conductive material having excellent electrical conductivity such as, for example, aluminum (Al), and may have a disk shape having a larger diameter than the electrostatic chuck 122.

The electrostatic chuck 122 may be installed to be fixed to the installation groove 121a of the fixing chuck 121. As an example, the electrostatic chuck 122 may be a circular plate composed of an insulating material such as, for example, a ceramic material. As described above, the electrostatic chuck 122 may include two polyimide-based films and a conductive thin film disposed therebetween. The conductive thin film may be connected to the high-voltage DC power supply 102 (see FIG. 1) disposed outside of the reaction chamber 110. When a predetermined voltage is applied to the conductive thin film from the high-voltage DC power supply 102, electric charges may be generated on surfaces of the polyimide-based films, and a coulomb force that fixes the wafer to an upper surface of the electrostatic chuck 122 may be generated. Therefore, the wafer loaded in the reaction chamber 110, or a sensor device 140 to be described later, on the electrostatic chuck 122 may be placed on the lift pins 122a.

The focus ring 123 may surround the electrostatic chuck 122. For example, the focus ring 123 may have a circular annular shape. The focus ring 123 may be made of a conductive material such as, for example, a metal. The focus ring 123 may move active ions and radicals of source plasma to a peripheral portion of the wafer, which may improve uniformity of a plasma sheath formed on the wafer. Therefore, the source plasma formed in an internal space of the reaction chamber 110 (see FIG. 1) may be formed intensively in an upper region of the wafer.

The focus ring 123 may be made of any one of, for example, silicon (Si), silicon carbide (SiC), silicon oxide ($SiO_2$), and aluminum oxide ($Al_2O_3$).

During the etching process for the wafer, the focus ring 123 may be worn together with the wafer.

The sensor device 140 may be transferred into or out of the reaction chamber 110. For example, the sensor device 140 may be supplied to the load lock chamber 150, and may then be transferred to the reaction chamber 110. As an example, the sensor device 140 may include a body 142 and a sensor 144.

The body 142 may have a plate shape. For example, the body 142 may have a disk shape corresponding to a shape of the wafer, and may have a size corresponding to a size of the wafer.

Herein, when the body 142 is described as having a plate shape or a disk shape corresponding to a shape of a wafer, the body 142 may have, for example, a circular shape corresponding to a wafer that also has a circular shape.

The sensor 144 may be disposed on an upper surface of the body 142, and may sense whether a thickness of the focus ring 123 is worn. For example, the sensor 144 may sense an amount of change in the thickness of the focus ring 123. When the thickness changes at least a predetermined amount, the sensor 144 may be considered to be worn. As an example, the sensor 144 may be disposed in plural on an edge portion of an upper surface of the body 142 in a circumferential direction. The sensor 144 may be, for example, a vision sensor or an image sensor. However, the present inventive concept is not limited thereto. For example, in exemplary embodiments, the sensor 144 may be any type of sensor capable of sensing the amount of change in the thickness of the focus ring 123.

Here, the circumferential direction refers to a direction of rotating along a circumference of the body 142.

When the sensor 144 is a vision sensor or an image sensor, the sensor 144 may acquire an image of the focus ring 123. The sensor 144 may be connected to the controller 170 (see FIG. 1), and the controller 170 may compare an initial image of the focus ring 123 with the acquired image of the focus ring 123 to calculate an amount of wear (e.g., the amount of change in the thickness of the focus ring 123).

The sensor 144 may be spaced apart from the focus ring 123 by a predetermined distance. When a distance between the sensor 144 and the focus ring 123 is less than about 2 cm or more than about 10 cm, the image of the focus ring 123 may be not clear, and it therefore may be difficult to determine whether the focus ring 123 is worn. Thus, to allow the sensor 144 to acquire an adequate image to accurately determine whether the focus ring 123 is worn, in exemplary embodiments, the sensor 144 may be spaced about 2 cm to about 10 cm apart from the focus ring 123, in consideration of, for example, a focal distance. In exemplary embodiments, the sensor 144 may be spaced about 4 cm to about 8 cm apart from the focus ring 123.

When the resolution of the sensor 144 is more than about 0.1 mm, it may be difficult to use the image obtained from the sensor 144 to accurately determine whether the focus ring 123 is worn. Thus, in exemplary embodiments, the resolution of the sensor 144 may be about 0.1 mm or less. The sensor 144 may acquire the image of the focus ring 123, and may store the image or send the image to the controller 170.

When the overall height of the sensor device 140 exceeds about 20 mm, a lower surface of the upper electrode 130 (see FIG. 1) and the sensor device 140 may interfere with each other and the sensor device 140 may be damaged, for example, in a case in which the sensor device 140 is transferred to or from the reaction chamber 110. Thus, as illustrated in FIG. 3, in exemplary embodiments, the entirety of a height (h) of the sensor device 140, for example, a height (h) from a lower surface of the body 142 to an upper surface of the sensor 144, may be about 20 mm or less. This may prevent damage to the sensor device 140 from occurring. For example, in exemplary embodiments, since the sensor device 140 is transferred to or from a space formed by the electrostatic chuck 122 and the upper electrode 130, the overall height (h) of the sensor device 140 is configured to be shorter than a distance between the electrostatic chuck 122 and the upper electrode 130 to prevent damage from occurring. Therefore, the overall height (h) of the sensor device 140 may be about 20 mm or less.

The elevating member 160 may be installed on the fixing chuck 121 to be movable up and down. To this end, the elevating member 160 may be connected to a driver that controls the physical movement of the elevating member 160. The elevating member 160 may contact the focus ring 123 to raise and lower the focus ring 123. The elevating member 160 may be connected to the controller 170, and the controller 170 may raise the elevating member 160 according to a signal received from the sensor 144. According to exemplary embodiments, a minimum driving unit of the elevating member 160 may be about 0.1 mm or less. According to exemplary embodiments, when the elevating member 160 is raised by one unit, an elevating distance of the elevating member 160 may be about 0.2 mm or less. According to exemplary embodiments, when the elevating member 160 is raised by ten units, an elevating distance of the elevating member 160 may be about 1 mm or less.

Hereinafter, an operation according to exemplary embodiments of the present inventive concept will be briefly described. First, when an amount of wear of the focus ring 123 is measured, an operator may load the sensor device 140 into the load lock chamber 150. The sensor device 140 may be then transferred to the reaction chamber 110 by the wafer transfer arm 152 of the load lock chamber 150. The sensor device 140 transferred to the reaction chamber 110 may be placed on the lift pins 122a of the electrostatic chuck 122.

Thereafter, the sensor 144 of the sensor device 140 may acquire an image of the focus ring 123. In this case, according to exemplary embodiments, no gas is supplied to the reaction chamber 110 during the image acquisition process. Since the sensor 144 is not exposed to gas during this process, accuracy of the image acquisition process may be improved. The image obtained by the sensor 144 may be transmitted to the controller 170, and the controller 170 may perform the comparison with the initial image of the focus ring 123 to calculate the amount of wear of the focus ring 123.

Thereafter, the controller 170 may raise the elevating member 160, depending on the amount of wear of the focus ring 123, to raise the focus ring 123.

Then, the sensor device 140 may be withdrawn from the reaction chamber 110.

As described above, the amount of wear of the focus ring 123 may be sensed through the sensor device 140, and the height of the focus ring 123 may be adjusted, depending on the amount of wear sensed through the sensor device 140.

As a result, a yield of an edge portion of the wafer by an etching process may be improved, and process capability may be stabilized by reducing a change in the process capability which varies with plasma exposure time of the component.

Further, the amount of wear of the focus ring 123 may be measured without releasing the vacuum in the reaction chamber 110. This may improve manufacturing efficiency, since the manufacturing process is not interrupted due to releasing the vacuum in the reaction chamber 110 during the measurement process. In addition, the sensor device 140 may be transferred to or from the reaction chamber 110. This may reduce the wear of the sensor device 140 due to the plasma, since the sensor device 140 may be transferred out of the reaction chamber 110 at appropriate times to avoid being exposed to the plasma. Therefore, according to exemplary embodiments, inaccuracy in measurement may be overcome in measuring the amount of wear of the sensor device 140, and efficiency of the manufacturing process may be improved.

Although the sensor device 140 is connected to the controller 170 in the exemplary embodiment described herein, the present inventive concept is not limited thereto. For example, in exemplary embodiments, information regarding the amount of wear of the focus ring 123 sensed by the sensor 144 of the sensor device 140 may be stored without the sensor device 140 being connected to the controller 170. Thereafter, after the sensor device 140 is transferred from the reaction chamber 110, the elevating member 160 may raise based on the information on the amount of wear of the focus ring 123 sensed by the sensor 144.

Figure 5:
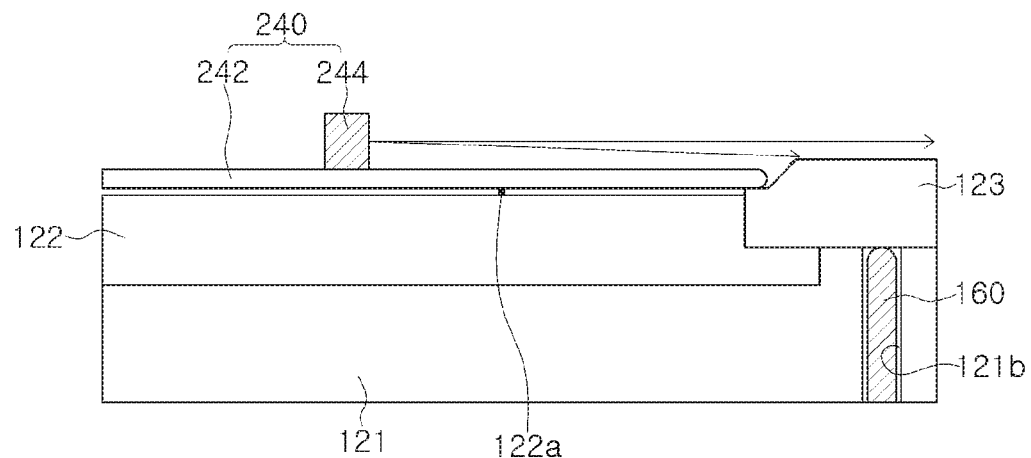
FIG. 5 is an enlarged view illustrating a modified exemplary embodiment of a sensor device.

FIG. 5 is an enlarged view illustrating a modified exemplary embodiment of a sensor device.

The same elements as those described above may be illustrated in the drawings using the reference numerals used above. Accordingly, for convenience of explanation, and a detailed description thereof will be omitted hereinafter.

Referring to FIG. 5, a sensor device 240 may include a body 242 and a sensor 244.

The body 242 may have a plate shape. As an example, the body 242 may have a disk shape corresponding to a shape of a wafer, and may have a size corresponding to a size of the wafer.

The sensor 244 may be disposed on an upper surface of the body 242, and may sense whether a thickness of the focus ring 123 is worn. For example, the sensor 244 may sense an amount of change in the thickness of the focus ring 123. As an example, the sensor 244 may be disposed in plural on an edge portion of an upper surface of the body 242 in a circumferential direction. The sensor 244 may be, for example, a vision sensor or an image sensor. However, the present inventive concept is not limited thereto. For example, the sensor 244 may employ any sensor capable of sensing an amount of wear of the focus ring 123. When the sensor 244 is a vision sensor or an image sensor, the sensor 244 may acquire an image of the focus ring 123. The sensor 244 may be connected to the controller 170 (see FIG. 1), and the controller 170 may compare an initial image of the focus ring 123 with the acquired image of the focus ring 123 to calculate the amount of wear of the focus ring 123.

In addition, the resolution of the sensor 244 may be about 0.1 mm or less.

Figure 6:
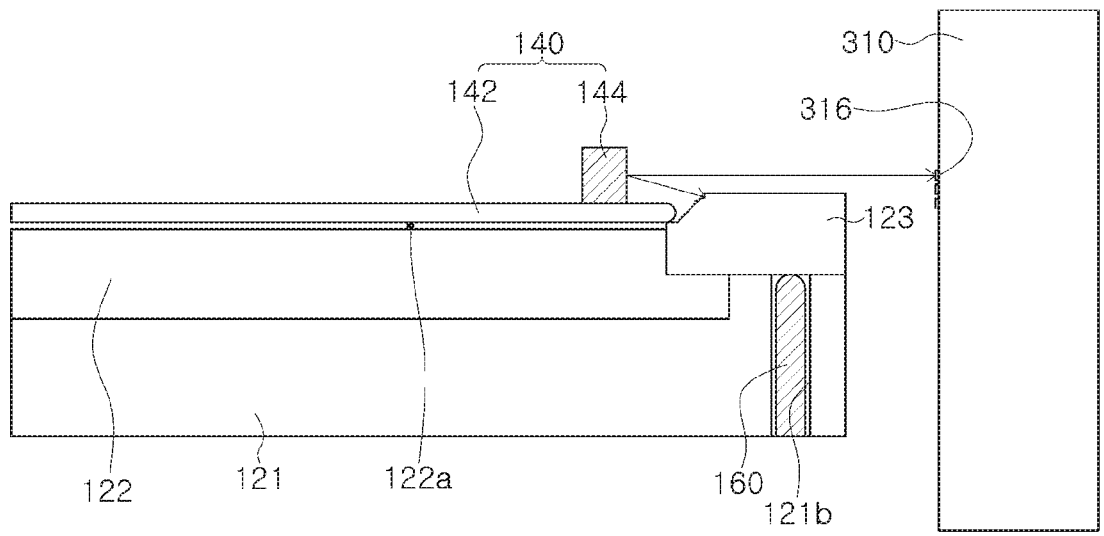
FIG. 6 is a view illustrating a modified exemplary embodiment of a reaction chamber provided in an etching apparatus according to exemplary embodiments.
Figure 7:
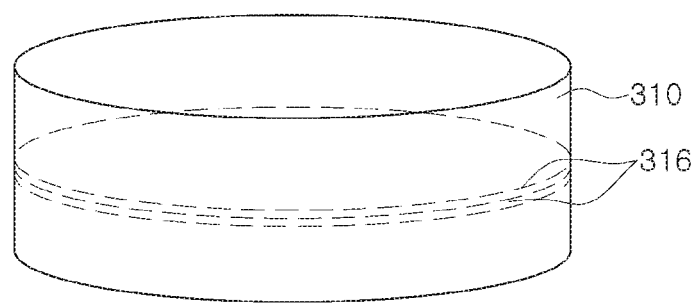
FIG. 7 is a view illustrating a recognition band of a reaction chamber according to exemplary embodiments.

FIG. 6 is a view illustrating a modified exemplary embodiment of a reaction chamber provided in an etching apparatus according to exemplary embodiments. FIG. 7 is a view illustrating a recognition band of a reaction chamber according to exemplary embodiments.

Referring to FIGS. 6 and 7, a reaction chamber 310 may be formed with a plurality of recognition bands 316 disposed on an inner surface thereof facing a sensor 144. The recognition bands 316 may be formed in a plurality of rows. Although the number of recognition bands 316 is three in FIGS. 6 and 7, the present inventive concept is not limited thereto. For example, according to exemplary embodiments, the number of recognition bands 316 may be variously changed.

Referring to the recognition bands 316, when a focus ring 123 is installed for the first time, only a portion of the plurality of recognition bands 316 formed in the reaction chamber 310 may be sensed by the sensor 144. For example, only one (or a number less than the entirety) of the plurality of recognition bands 316 may be sensed by the sensor 144 when a focus ring 123 is first installed.

Thereafter, when the etching process proceeds, the focus ring 123 may be worn. After the focus ring 123 is worn as described above, a sensor device 140 may be transferred to the reaction chamber 310, and the sensor 144 may sense an amount of wear of the focus ring 123. In this case, at least a portion of the plurality of recognition bands 316 not sensed by wear of the focus ring 123 during the first installation time may be sensed. For example, in exemplary embodiments, when a first of the three recognition bands 316 is sensed by the sensor 144 when the focus ring 123 is first installed, the sensor 144 does not again sense this same first recognition band 316 at this time, but rather, senses the second or third of the three recognition bands 316 instead. Therefore, a degree of wear of the focus ring 123 may be more clearly recognized due to the number of recognition bands 316 sensed.

Figure 8:
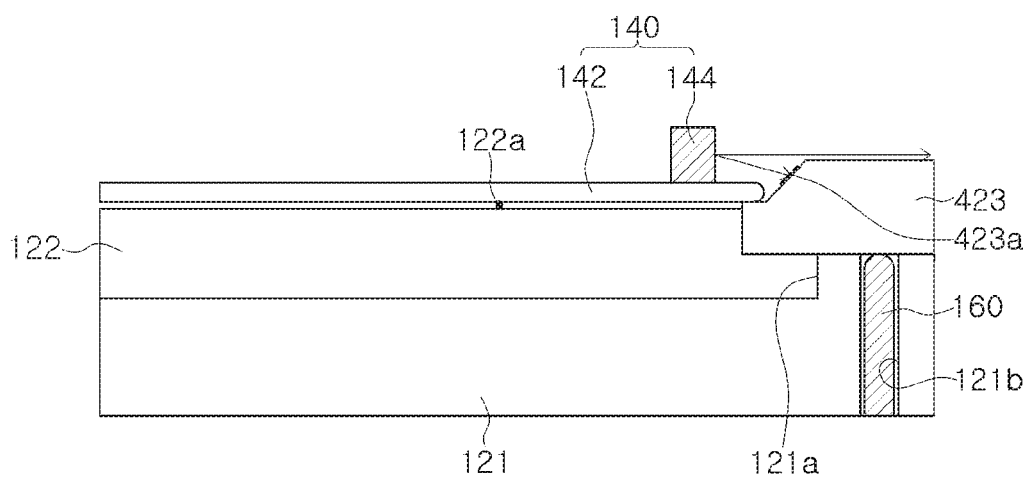
FIG. 8 is a view illustrating a modified exemplary embodiment of a focus ring provided in an etching apparatus according to exemplary embodiments.
Figure 9:
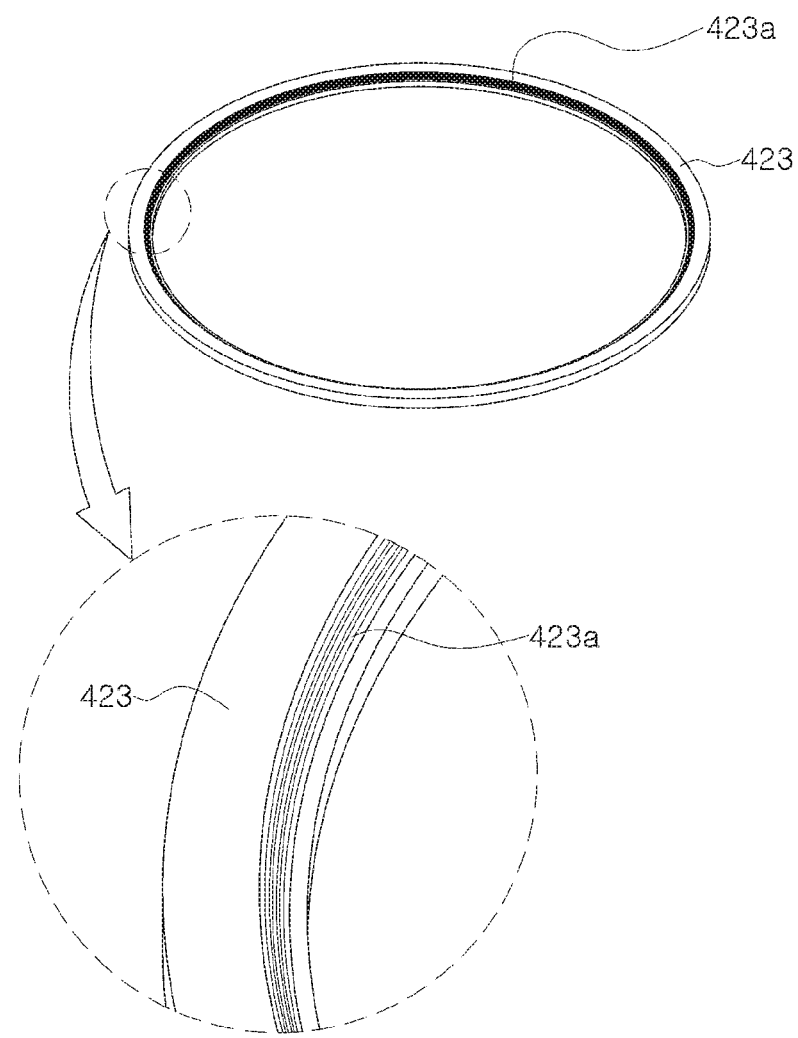
FIG. 9 is a view illustrating a recognition band of a focus ring according to exemplary embodiments.

FIG. 8 is a view illustrating a modified exemplary embodiment of a focus ring provided in an etching apparatus according to exemplary embodiments. FIG. 9 is a view illustrating a recognition band of a focus ring according to exemplary embodiments.

Referring to FIGS. 8 and 9, a focus ring 423 may have a plurality of recognition bands 423a disposed on an inner surface thereof facing a sensor 144. The recognition bands 423a may be formed in a plurality of rows. Although the number of recognition bands 423a is three in FIGS. 8 and 9, the present inventive concept is not limited thereto. For example, the number of recognition bands 423a may be variously changed.

Referring to the recognition bands 423a, when the focus ring 423 is installed for the first time, all of the recognition band 423a may be sensed by the sensor 144.

Thereafter, when the etching process proceeds, the focus ring 423 may be worn. Therefore, a portion of the recognition bands 423a may be removed by wear. After the focus ring 423 is worn as described above, a sensor device 140 may be transferred to the reaction chamber 110 (see FIG. 1), and the sensor 144 may sense an amount of wear of the focus ring 423. In this case, at least a portion of the recognition bands 423a (e.g., the portion previously removed by wear) may be not sensed. As a result, a degree of wear of the focus ring 423 may be more clearly recognized due to the number of recognition bands 423a sensed.

Figure 10:
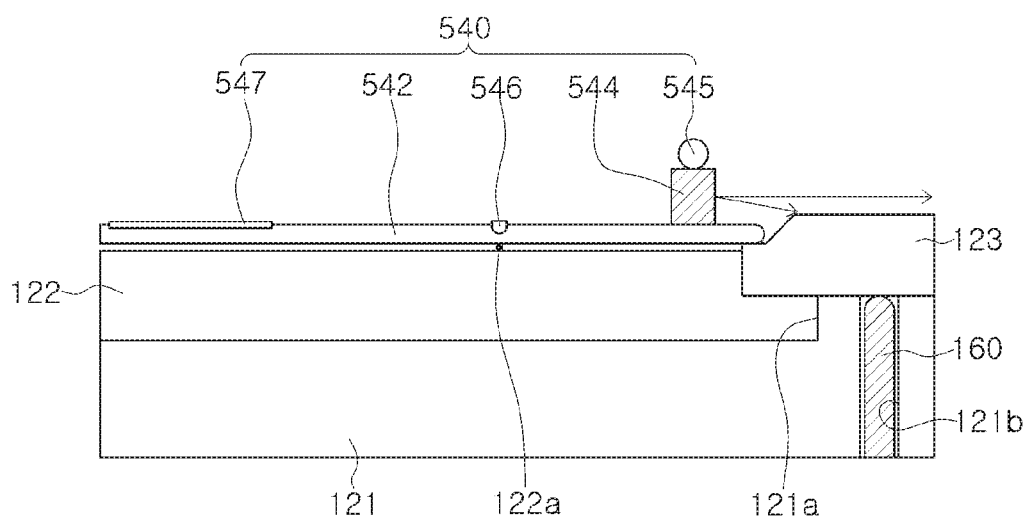
FIG. 10 is an enlarged view illustrating a modified exemplary embodiment of a sensor device.

FIG. 10 is an enlarged view illustrating a modified exemplary embodiment of a sensor device.

Referring to FIG. 10, a sensor device 540 may include a body 542, a sensor 544, a light source 545, a lift pin sensing sensor 546, and a gravity sensor 547.

The body 542 may have a plate shape. As an example, the body 542 may have a disk shape corresponding to a shape of a wafer, and may have a size corresponding to a size of the wafer.

The sensor 544 may be disposed on an upper surface of the body 542, and may sense whether a thickness of a focus ring 123 is worn. For example, the sensor 544 may sense an amount of change in the thickness of the focus ring 123. As an example, the sensor 544 may be disposed in plural on an edge portion of an upper surface of the body 542 in a circumferential direction. The sensor 544 may be, for example, a vision sensor or an image sensor. However, the present inventive concept is not limited thereto. For example, in exemplary embodiments, the sensor 544 may employ any sensor capable of sensing an amount of wear of the focus ring 123. When the sensor 544 is a vision sensor or an image sensor, the sensor 544 may acquire an image of the focus ring 123. The sensor 544 may be connected to the controller 170 (see FIG. 1), and the controller 170 may compare an initial image of the focus ring 123 with the acquired image of the focus ring 123 to calculate the amount of wear of the focus ring 123.

The sensor 544 may be spaced apart from the focus ring 123 by a predetermined distance. For example, the sensor 544 may be spaced apart from the focus ring 123 to acquire an image by the sensor 544. In exemplary embodiments, the sensor 544 may be spaced about 2 cm to about 10 cm apart from the focus ring 123, in consideration of, for example, a focal distance. As an example, the sensor 544 may be spaced about 4 cm to about 8 cm apart from the focus ring 123.

In addition, the resolution of the sensor 544 may be about 0.1 mm or less.

The light source 545 may be disposed near or on the sensor 544. As an example, the light source 545 may be an LED light source. However, the light source 545 is not limited thereto. The arrangement position and type of the light source 545 may be variously changed. For example, the light source 545 may be additionally provided in the sensor device 540. The light provided by the light source 545 may reduce error caused by darkness inside the reaction chamber 110 (see FIG. 1).

The lift pin sensing sensor 546 may be installed in the body 542 to be disposed at a position corresponding to a lift pin 122a of an electrostatic chuck 122. The lift pin sensing sensor 546 senses the state of the lift pin 122a of the electrostatic chuck 122. In this way, since an alignment operation of the sensor device 540 may be performed through the lift pin sensing sensor 546, accuracy of the alignment operation of the sensor device 540 may be improved. Therefore, wear of the focus ring 123 may be sensed more accurately by the sensor 544.

The gravity sensor 547 may sense a gradient of the sensor device 540, and may be disposed in a central portion of the body 542. Since the sensor device 540 may be provided with the gravity sensor 547, the sensor device 540 may be mounted on the electrostatic chuck 122 while sensing a gradient of the body 542. Therefore, wear of the focus ring 123 may be sensed more accurately by the sensor 544.

Figure 11:
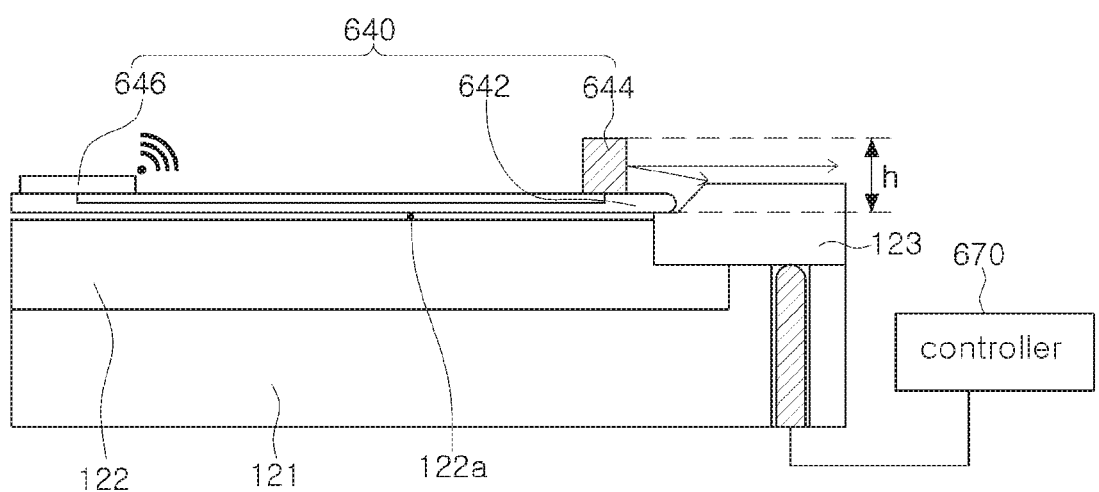
FIG. 11 is an enlarged view illustrating a modified exemplary embodiment of a sensor device.

FIG. 11 is an enlarged view illustrating a modified exemplary embodiment of a sensor device.

Referring to FIG. 11, a sensor device 640 may include a body 642, a sensor 644, and a wireless transceiver 646.

The body 642 may have a plate shape. As an example, the body 642 may have a disk shape corresponding to a shape of a wafer, and may have a size corresponding to a size of the wafer.

The sensor 644 may be disposed on an upper surface of the body 642, and may sense whether a thickness of a focus ring 123 is worn. For example, the sensor 644 may sense an amount of change in the thickness of the focus ring 123. As an example, the sensor 644 may be disposed in plural on a central portion of an upper surface of the body 642 in a circumferential direction. The sensor 644 may be, for example, a vision sensor or an image sensor. However, the present inventive concept is not limited thereto. For example, in exemplary embodiments, the sensor 644 may employ any sensor capable of sensing an amount of wear of the focus ring 123. When the sensor 644 is a vision sensor or an image sensor, the sensor 644 may acquire an image of the focus ring 123. The sensor 644 may be connected to the wireless transceiver 646.

The sensor 644 may be spaced apart from the focus ring 123 by a predetermined distance. When a distance between the sensor 644 and the focus ring 123 is less than about 2 cm or more than about 10 cm, the image of the focus ring 123 may be not clear, and it therefore may be difficult to determine whether the focus ring 123 is worn. Thus, to allow the sensor 644 to acquire an adequate image to accurately determine whether the focus ring 123 is worn, in exemplary embodiments, the sensor 644 may be spaced about 2 cm to about 10 cm apart from the focus ring 123, in consideration of, for example, a focal distance. In exemplary embodiments, the sensor 644 may be spaced about 4 cm to about 8 cm apart from the focus ring 123.

When the resolution of the sensor 644 is more than about 0.1 mm, it may be difficult to use the image obtained from the sensor 644 to accurately determine whether the focus ring 123 is worn. Thus, in exemplary embodiments, the resolution of the sensor 644 may be about 0.1 mm or less. The sensor 644 may acquire the image of the focus ring 123, and may store the image or send the image to a controller 670.

When the overall height of the sensor device 640 exceeds about 20 mm, a lower surface of the upper electrode 130 (see FIG. 1) and the sensor device 640 may interfere with each other and the sensor device 640 may be damaged, for example, in a case in which the sensor device 640 is transferred to or from the reaction chamber 110 (see FIG. 1). Thus, as illustrated in FIG. 11, in exemplary embodiments, the entirety of a height (h) of the sensor device 640, for example, a height (h) from a lower surface of the body 642 to the higher of an upper surface of the sensor 644 or an upper surface of the wireless transceiver 646 may be about 20 mm or less. This may prevent damage to the sensor device 640 from occurring. For example, in exemplary embodiments, since the sensor device 640 is transferred to or from a space formed by the electrostatic chuck 122 (see FIG. 1) and the upper electrode 130, the overall height (h) of the sensor device 640 is configured to be shorter than a distance between the electrostatic chuck 122 and the upper electrode 130 to prevent damage from occurring. Therefore, the overall height (h) of the sensor device 640 may be about 20 mm or less.

The wireless transceiver 646 may be in communication with the sensor 644 and the controller 670, and may be installed in the central portion of the body 642. A signal for wear of the focus ring 123 sensed by the sensor 644 may be sent to the wireless transceiver 646. Then, the wireless transceiver 646 may transmit the signal regarding the wear of the focus ring 123 to the controller 670, which may be externally located from the sensor device 640 and disposed in an etching apparatus. Then, the controller 670 may calculate the degree of wear of the focus ring 123. Thereafter, the controller 670 may raise the elevating member 160, depending on the degree of wear of the focus ring 123.

Figure 12:
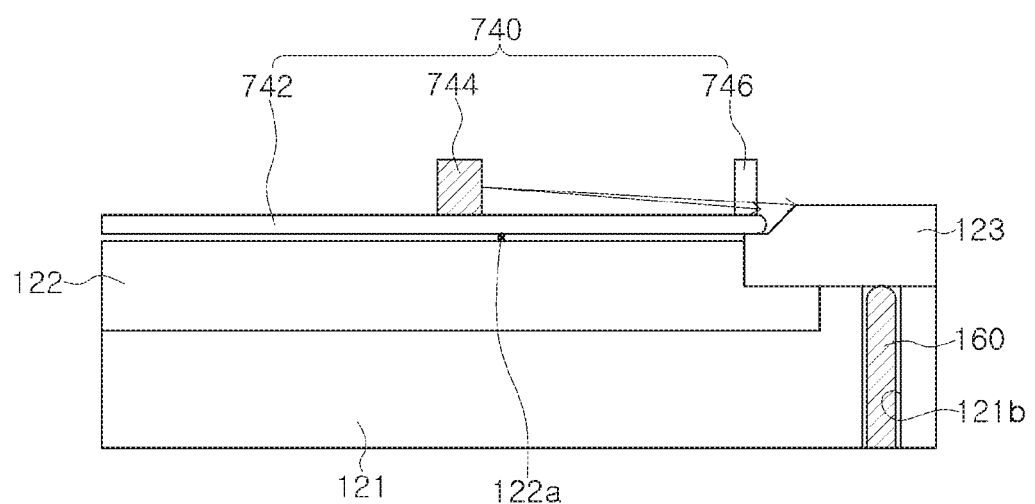
FIG. 12 is an enlarged view illustrating a modified exemplary embodiment of a sensor device.

FIG. 12 is an enlarged view illustrating a modified exemplary embodiment of a sensor device.

Referring to FIG. 12, a sensor device 740 may include a body 742, a sensor 744, and a sight 746.

The body 742 has a plate shape. As an example, the body 742 may have a disk shape corresponding to a shape of a wafer, and may have a size corresponding to a size of the wafer.

The sensor 744 may be disposed on an upper surface of the body 742, and may sense whether a thickness of a focus ring 123 is worn. For example, the sensor 744 may sense an amount of change in the thickness of the focus ring 123. As an example, the sensor 744 may be disposed in plural on an edge portion of an upper surface of the body 742 in a circumferential direction. The sensor 744 may be, for example, a vision sensor or an image sensor. However, the present inventive concept is not limited thereto. For example, in exemplary embodiments, the sensor 744 may employ any sensor capable of sensing an amount of wear of the focus ring 123.

When the sensor 744 is a vision sensor or an image sensor, the sensor 744 may acquire an image of the focus ring 123. The sensor 744 may be connected to the controller 170 (see FIG. 1), and the controller 170 may compare an initial image of the focus ring 123 with the acquired image of the focus ring 123 to calculate the amount of wear of the focus ring 123.

The sensor 744 may be spaced apart from the focus ring 123 by a predetermined distance. For example, the sensor 744 may be spaced apart from the focus ring 123 to acquire an image by the sensor 744. The sensor 744 may be spaced about 2 cm to about 10 cm apart from the focus ring 123, in consideration of, for example, a focal distance. As an example, the sensor 744 may be spaced about 4 cm to about 8 cm apart from the focus ring 123.

In addition, the resolution of the sensor 744 may be about 0.1 mm or less.

The sight 746 may be mounted on the body 742 such that it is disposed in front of the sensor 744. The sight 746 may be, for example, a calibrated sight. Therefore, wear of the focus ring 123 may be more accurately recognized by the sight 746. As an example, the sight 746 may be made of a transparent material. The sight 746 may be used to, for example, optically enhance the image acquired by the sensor 744 and/or aid in visual alignment of the sensor 744 with the intended target area.

According to exemplary embodiments, an etching apparatus capable of measuring an amount of wear of the focus ring may be provided.

Further, according to exemplary embodiments, an etching apparatus capable of compensating a height of the focus ring may be provided.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. An etching apparatus, comprising:
a reaction chamber having an internal space;
a fixing chuck disposed in the reaction chamber;
an electrostatic chuck disposed on the fixing chuck and on which a wafer is placed;
a focus ring surrounding the electrostatic chuck; and
a sensor device configured to be transferred into and out of the reaction chamber and placed on the electrostatic chuck,
wherein the sensor device comprises:
a body having a plate shape;
a sensor disposed on an upper surface of the body which senses whether the focus ring is worn; and
a light source disposed on an upper surface of the sensor,
wherein the sensor device is disposed on an upper surface of the electrostatic chuck, the light source emits light toward the focus ring in a lateral direction, and the sensor provides a sensing signal, which senses whether the focus ring is worn, toward the focus ring in the lateral direction.

2. The etching apparatus according to claim 1, further comprising:
an elevating member contacting the focus ring which raises and lowers the focus ring.

3. The etching apparatus according to claim 2, wherein a minimum driving unit of the elevating member is about 0.1 mm or less.

4. The etching apparatus according to claim 1, wherein the sensor is disposed on an edge portion of the upper surface of the body.

5. The etching apparatus according to claim 4, wherein the sensor is spaced about 4 cm to about 8 cm apart from the focus ring.

6. The etching apparatus according to claim 1, wherein the sensor is one of a plurality of sensors disposed in a circumferential direction, and the sensor is a vision sensor or an image sensor.

7. The etching apparatus according to claim 6, wherein a resolution of the sensor is about 0.1 mm or less.

8. The etching apparatus according to claim 1, further comprising:
a plurality of recognition bands formed on an inner surface of the reaction chamber and opposing the sensor.

9. The etching apparatus according to claim 1, further comprising:
a plurality of recognition bands formed on an inner surface of the focus ring.

10. The etching apparatus according to claim 1, wherein the sensor device further comprises a lift pin sensing sensor which senses a state of a lift pin provided on the electrostatic chuck.

11. The etching apparatus according to claim 1, wherein the sensor device further comprises a gravity sensor which senses a gradient of the body, and which is disposed in a central portion of the body.

12. The etching apparatus according to claim 1, wherein the sensor device further comprises a wireless transceiver mounted on the body.

13. The etching apparatus according to claim 12, wherein the wireless transceiver is in communication with the sensor and a controller.

14. The etching apparatus according to claim 13, further comprising:
an elevating member contacting the focus ring which raises and lowers the focus ring, wherein the controller raises and lowers the elevating member depending on an amount of wear of the focus ring sensed by the sensor.

15. The etching apparatus according to claim 1, wherein the sensor device further comprises a calibrated sight disposed in front of the sensor.

16. An etching apparatus, comprising:
a reaction chamber having an internal space;
a fixing chuck disposed in the reaction chamber;
an electrostatic chuck disposed on the fixing chuck and on which a wafer or a sensor device is placed;
a focus ring disposed on an edge of the electrostatic chuck;
a sensor device configured to be transferred into and out of the reaction chamber; and
an elevating member which raises and lowers the focus ring,
wherein the sensor device comprises:
a body having a shape corresponding to a shape of the wafer;
a sensor installed on the body which obtains an image of the focus ring; and
a light source disposed on an upper surface of the sensor,
wherein the sensor device is disposed on an upper surface of the electrostatic chuck, the light source emits light toward the focus ring in a lateral direction, and the sensor obtains the image of the focus ring from the lateral direction.

17. The etching apparatus according to claim 16, further comprising:
a controller connected to the sensor device and the elevating member, wherein the controller raises and lowers the elevating member depending on a signal received from the sensor device.

18. The etching apparatus according to claim 17, wherein the controller calculates an amount of change in a thickness of the focus ring.

* * * * *